United States Patent
Reznicek et al.

(10) Patent No.: US 10,872,953 B2
(45) Date of Patent: Dec. 22, 2020

(54) NANOSHEET SUBSTRATE ISOLATED SOURCE/DRAIN EPITAXY BY COUNTER-DOPED BOTTOM EPITAXY

(71) Applicant: International Business Machines Corporation, Armonk, NY (US)

(72) Inventors: Alexander Reznicek, Troy, NY (US); Bahman Hekmatshoartabari, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 418 days.

(21) Appl. No.: 15/872,610

(22) Filed: Jan. 16, 2018

(65) Prior Publication Data

US 2019/0221638 A1    Jul. 18, 2019

(51) Int. Cl.
| | |
|---|---|
| H01L 21/8238 | (2006.01) |
| H01L 29/06 | (2006.01) |
| H01L 29/78 | (2006.01) |
| H01L 29/66 | (2006.01) |
| H01L 21/761 | (2006.01) |
| H01L 29/423 | (2006.01) |
| H01L 21/765 | (2006.01) |
| H01L 29/786 | (2006.01) |

(52) U.S. Cl.
CPC ........ *H01L 29/0646* (2013.01); *H01L 21/761* (2013.01); *H01L 21/765* (2013.01); *H01L 29/0673* (2013.01); *H01L 29/42392* (2013.01); *H01L 29/6653* (2013.01); *H01L 29/6681* (2013.01); *H01L 29/66439* (2013.01); *H01L 29/66553* (2013.01); *H01L 29/7853* (2013.01); *H01L 29/78696* (2013.01)

(58) Field of Classification Search
None
See application file for complete search history.

(56) References Cited

U.S. PATENT DOCUMENTS

2016/0163796 A1*   6/2016   Obradovic ............. B82Y 10/00
                                                                257/9

* cited by examiner

*Primary Examiner* — Fernando L Toledo
*Assistant Examiner* — Lawrence-Linh T Nguyen
(74) *Attorney, Agent, or Firm* — Scully, Scott, Murphy & Presser, P.C.; L. Jeffrey Kelly, Esq.

(57) ABSTRACT

Parasitic transistor formation under a semiconductor containing nanosheet device is eliminated by forming a counter doped semiconductor layer on a physically exposed and recessed surface of a semiconductor substrate after formation of a nanosheet stack of alternating nanosheets of a sacrificial semiconductor material nanosheet and a semiconductor channel material nanosheet on a portion of the semiconductor substrate. The presence of the counter doped semiconductor layer isolates the source/drain regions from the semiconductor substrate and eliminates parasitic transistor formation.

19 Claims, 11 Drawing Sheets

NANOSHEET SUBSTRATE ISOLATED SOURCE/DRAIN EPITAXY BY COUNTER-DOPED BOTTOM EPITAXY

BACKGROUND

The present application relates to a semiconductor structure and a method of forming the same. More particularly, the present application relates to a semiconductor structure containing at least one stacked semiconductor material nanosheet device that is devoid of a parasitic transistor beneath the at least one stacked semiconductor nanosheet device. The present application also relates to a method of forming such a semiconductor structure.

The use of non-planar semiconductor devices such as, for example, semiconductor fin field effect transistors (FinFETs) is the next step in the evolution of complementary metal oxide semiconductor (CMOS) devices. One type of non-planar semiconductor device that has been touted as a viable option beyond the 7 nm technology node is a nanosheet containing device. By "nanosheet containing device" it is meant that the device contains one or more layers of semiconductor channel material portions having a vertical thickness that is substantially less than its width.

Nanosheet formation relies on the selective removal of one semiconductor material (e.g., silicon) to another semiconductor material (e.g., a silicon germanium alloy) to form suspended nanosheets for gate-all-around devices. In the prior art, source/drain (S/D) regions for nanosheet containing devices are formed by epitaxial growth of a semiconductor material upwards from an exposed surface of the semiconductor substrate and from sidewalls of each nanosheet. Such a bottom up epitaxial growth of the S/D regions from the semiconductor substrate creates an undesirable parasitic transistor under the nanosheet stack. There is a need for providing nanosheet containing devices that avoid such a bottom up epitaxial growth of the S/D regions.

SUMMARY

Parasitic transistor formation under a semiconductor containing nanosheet device is eliminated by forming a counter doped semiconductor layer on a physically exposed and recessed surface of a semiconductor substrate after formation of a nanosheet stack of alternating nanosheets of a sacrificial semiconductor material nanosheet and a semiconductor channel material nanosheet on a portion of the semiconductor substrate. The presence of the counter doped semiconductor layer isolates the source/drain regions from the semiconductor substrate and eliminates parasitic transistor formation.

One aspect of the present application relates to a semiconductor containing nanosheet device (i.e., semiconductor structure) that is devoid of any parasitic transistor. In one embodiment, the semiconductor structure includes a plurality of stacked and suspended semiconductor channel material nanosheets located above a semiconductor substrate that is composed of a semiconductor material of a first conductivity type. A functional gate structure surrounds a portion of each semiconductor channel material nanosheet of the plurality of stacked and suspended semiconductor channel material nanosheets. A counter doped semiconductor layer composed of a semiconductor material of a second conductivity type that is different from the first conductivity type is located on a recessed surface of the semiconductor substrate. A source/drain (S/D) region is present on each side of the functional gate structure and physically contacts sidewalls of each semiconductor channel material nanosheet of the plurality of stacked and suspended semiconductor channel material nanosheets, wherein the source/drain (S/D) region is located directly on a surface of the counter doped semiconductor layer.

Another aspect of the present application relates to a method of forming a semiconductor containing nanosheet device that is devoid of any parasitic transistor. In one embodiment, the method includes providing a nanosheet stack of alternating nanosheets of a sacrificial semiconductor material nanosheet and a semiconductor channel material nanosheet located on a surface of a semiconductor substrate composed of a semiconductor material of a first conductivity type, wherein a sacrificial gate structure and a dielectric spacer material layer straddle over the nanosheet stack, and the semiconductor substrate has physically exposed recessed surfaces that lay adjacent the sacrificial gate structure and the dielectric spacer material layer. End portions of each of the sacrificial semiconductor material nanosheets are then recessed to provide a gap between each of the semiconductor channel material nanosheets. An additional dielectric spacer material layer is formed on the dielectric spacer material layer and within each gap and on the recessed surfaces of the semiconductor substrate. Next, the additional dielectric spacer material layer is removed from the recessed surfaces to re-expose the recessed surface. A counter doped semiconductor layer composed of a semiconductor material of a second conductivity type that differs from the first conductivity type is then formed on the re-exposed recessed surfaces of the semiconductor substrate. The sidewalls of each semiconductor channel material nanosheet are then physically exposed, and thereafter, a source/drain (S/D) region is formed by epitaxial growth of a semiconductor material on the physically exposed sidewalls of each semiconductor channel material nanosheet, wherein each S/D region is present on a surface of one of the counter doped semiconductor layers.

DETAILED DESCRIPTION

Figure 1:
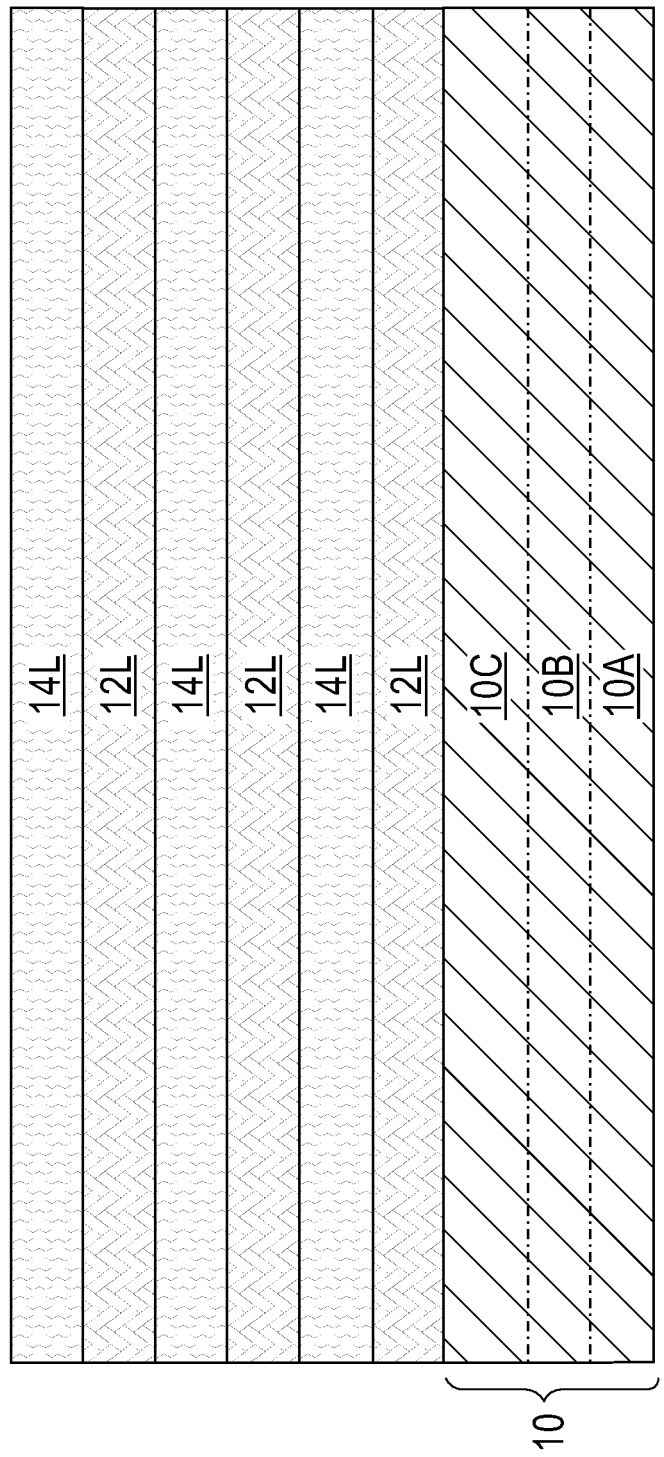
FIG. 1 is a cross sectional view of an exemplary semiconductor structure including a semiconductor material stack of alternating layers of a sacrificial semiconductor material layer and a semiconductor channel material layer on a surface of a semiconductor substrate that can be employed in accordance with an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring now to FIG. 1, there is illustrated an exemplary semiconductor structure at an early stage of fabrication and in accordance with an embodiment of the present application. The exemplary semiconductor structure of FIG. 1 includes a semiconductor material stack of alternating layers of a sacrificial semiconductor material layer 12L and a semiconductor channel material layer 14L on a surface of a semiconductor substrate 10.

The semiconductor substrate 10 may include any semiconductor material including, for example, silicon. The term "semiconductor material" is used throughout the present application to denote a material that has semiconducting properties. Besides silicon, the semiconductor material may be germanium (Ge), a silicon germanium alloy (SiGe), III-V compound semiconductors or II-VI compound semiconductors.

The semiconductor material that can be employed as the semiconductor substrate 10 is of a first conductivity type. That is, the semiconductor material that provides the semiconductor substrate 10 includes a p-type dopant or an n-type dopant. The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium and indium. "N-type" refers to the addition of impurities that contributes free electrons to an intrinsic semiconductor. In a silicon containing semiconductor material, examples of n-type dopants, i.e., impurities, include, but are not limited to, antimony, arsenic and phosphorous.

As illustrated in FIG. 1, the semiconductor substrate 10 may include a lower region 10A having a first dopant concentration, a middle region 10B having a second dopant concentration, and an upper region having a third dopant concentration in which the second dopant concentration is less than the first and third dopant concentrations. In one embodiment, the first dopant concentration within the lower region 10A may range from $1 \times 10^{18}$ atoms/cm$^3$ to $8 \times 10^{18}$ atoms/cm$^3$, the second dopant concentration within the middle regions 10B may range from $5 \times 10^{16}$ atoms/cm$^3$ to $8 \times 10^{17}$ atoms/cm$^3$, and the third dopant within the upper region 10C may range from $5 \times 10^{18}$ atoms/cm$^3$ to $5 \times 10^{19}$ atoms/cm$^3$. The different dopant concentrations can be obtained by ion implantation using different implant energies. The use of semiconductor substrate 10 that includes the various dopant regions (10A, 10B, and 10C) provides improved electrostatic properties to the final structure.

Semiconductor material stack (12L, 14L) is then formed upon the semiconductor substrate 10. As mentioned above, semiconductor material stack (12L, 14L) includes sacrificial semiconductor material layers 12L and semiconductor channel material layers 14L which alternate one atop the other. In FIG. 1 and by way of one example, semiconductor material stack (12L, 14L) includes three sacrificial semiconductor material layers 12L and three semiconductor channel material layers 14L. The semiconductor material stack that can be employed in the present application is not limited to the specific embodiment illustrated in FIG. 1. Instead, the semiconductor material stack can include any number of sacrificial semiconductor material layers 12L and corresponding semiconductor channel material layers 14L.

Each sacrificial semiconductor material layer 12L is composed of a first semiconductor material which differs in composition from at least an upper portion of the semiconductor substrate 10. In one embodiment, the upper portion of the semiconductor substrate 10 is composed of silicon, while each sacrificial semiconductor material layer 12L is composed of a silicon germanium alloy. The first semiconductor material that provides each sacrificial semiconductor material layer 12L can be formed utilizing an epitaxial growth (or deposition process) as defined in greater detail herein below.

Each semiconductor channel material layer 14L is composed of a second semiconductor material that has a different etch rate than the first semiconductor material that provides the sacrificial semiconductor material layers 12L. The second semiconductor material that provides each semiconductor channel material layer 14L may be the same as, or different from, the semiconductor material that provides at least the upper portion of the semiconductor substrate 10. In one example, at least the upper portion of the semiconductor substrate 10 and each semiconductor channel material layer 14L is composed of Si or a III-V compound semiconductor, while each sacrificial semiconductor material layer 12L is composed of a silicon germanium alloy. The second semiconductor material that provides each semiconductor channel material layer 14L can be formed utilizing an epitaxial growth (or deposition process) as defined in greater detail herein below.

Semiconductor material stack (12L, 14L) can be formed by sequential epitaxial growth of alternating layers of the first semiconductor material and the second semiconductor material. Following epitaxial growth of the topmost layer of the semiconductor material stack (12L, 14L) a patterning process may be used to provide the semiconductor material stack (12L, 14L) shown in FIG. 1. Patterning may be achieved by lithography and etching as is well known to those skilled in the art.

The terms "epitaxially growing and/or depositing" and "epitaxially grown and/or deposited" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed.

Examples of various epitaxial growth process apparatuses that can be employed in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 550° C. to 900° C. Although higher temperature typically results in faster deposition, the faster deposition may result in crystal defects and film cracking. The epitaxial growth of the first and second semiconductor materials that provide the sacrificial semiconductor material layers and the semiconductor channel material layers, respectively, can be performed utilizing any well known precursor gas or gas mixture. Carrier gases like hydrogen, nitrogen, helium and argon can be used.

The sacrificial semiconductor material layers 12L may have a thickness from 5 nm to 12 nm, while the semiconductor channel material layers 14L may have a thickness from 6 nm to 12 nm. Each sacrificial semiconductor material layer 12L may have a thickness that is the same as, or different from, a thickness of each semiconductor channel material layer 14L.

Figure 2:
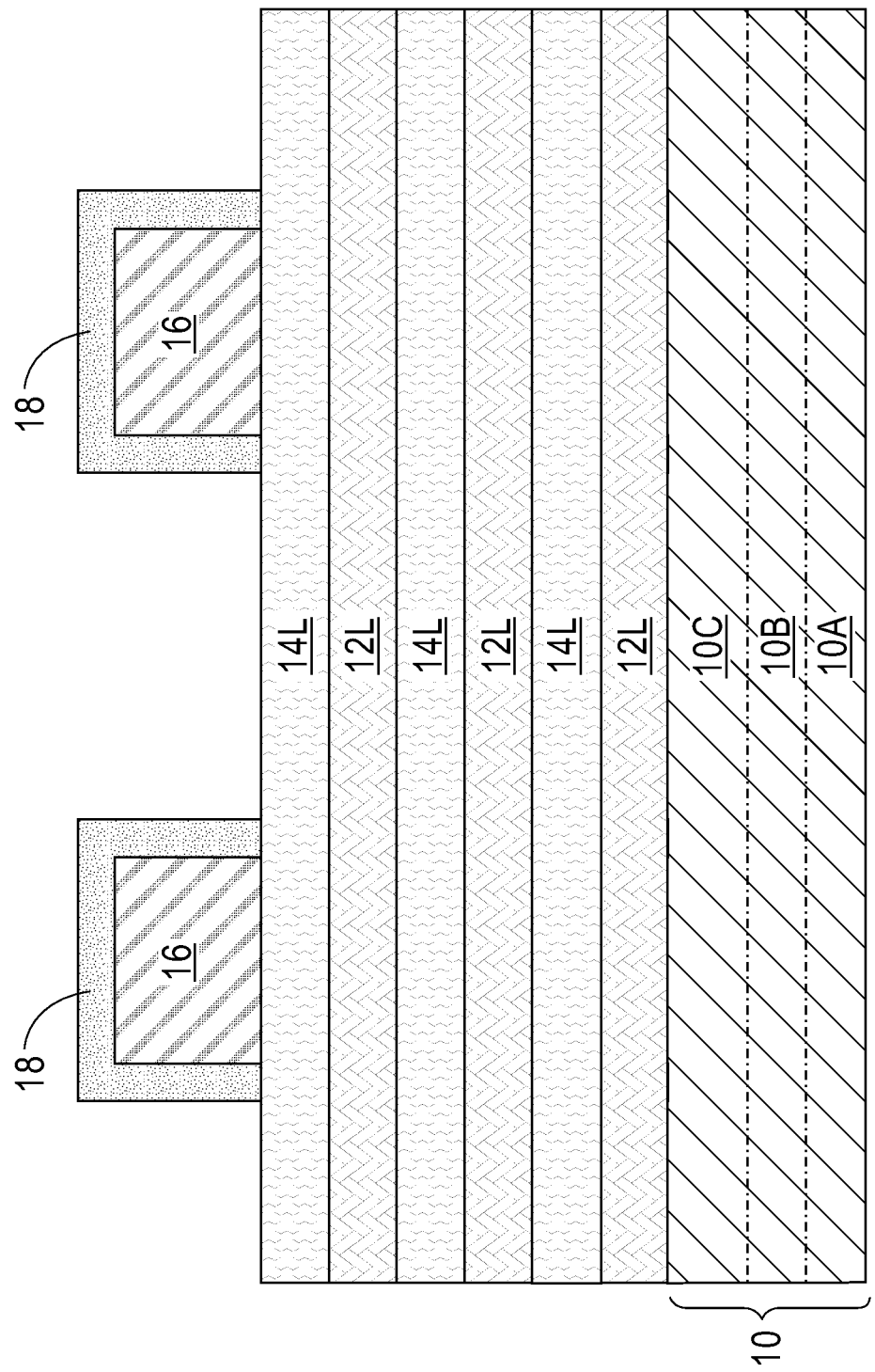
FIG. 2 is a cross sectional view of the exemplary semiconductor structure of FIG. 1 after forming at least one sacrificial gate structure and a dielectric spacer material layer.

Referring now to FIG. 2, there is illustrated the exemplary semiconductor structure of FIG. 1 after forming at least one sacrificial gate structure 16 and a dielectric spacer material layer 18. By way of illustration, two sacrificial gate structures 16 are exemplified in the drawings of the present application. Each sacrificial gate structure 16 is located on a first side and a second side of the semiconductor material stack (12L, 14L) and spans across a topmost surface of a portion of the semiconductor material stack (12L, 14L). Each sacrificial gate structure 16 thus straddles over a portion of the semiconductor material stack (12L, 14L). The dielectric spacer material layer 18 is present on sidewalls and a topmost surface of each sacrificial gate structure 16; the dielectric spacer material layer 18 thus also straddles over the semiconductor material stack (12L, 14L).

It is noted that in the drawings, the sacrificial gate structures 16 and dielectric spacer material layer 18 are only shown as being present atop, not along sidewalls, of the semiconductor material stack (12L, 14L). This was done for clarity and to illustrate the nanosheet stack that will be subsequently formed beneath the sacrificial gate structures 16 and the dielectric spacer material layer 18.

Each sacrificial gate structure 16 may include a single sacrificial material portion or a stack of two or more sacrificial material portions (i.e., at least one sacrificial material portion). In one embodiment, the at least one sacrificial material portion comprises, from bottom to top, a sacrificial gate dielectric portion, a sacrificial gate portion and a sacrificial dielectric cap portion. In some embodiments, the sacrificial gate dielectric portion and/or the sacrificial dielectric cap portion can be omitted and only a sacrificial gate portion is formed. The at least one sacrificial material portion can be formed by forming a blanket layer (or layers) of a material (or various materials) and then patterning the material (or various materials) by lithography and an etch. In one embodiment, the at least one sacrificial material portion can be formed by first depositing a blanket layer of a sacrificial gate dielectric material. The sacrificial gate dielectric material can be an oxide, nitride, and/or oxynitride. In one example, the sacrificial gate dielectric material can be a high k material having a dielectric constant greater than silicon dioxide. In some embodiments, a multilayered dielectric structure comprising different dielectric materials, e.g., silicon dioxide, and a high k dielectric can be formed and used as the sacrificial gate portion. The sacrificial gate dielectric material can be formed by any deposition technique including, for example, chemical vapor deposition (CVD), plasma enhanced chemical vapor deposition (PECVD), physical vapor deposition (PVD), sputtering, or atomic layer deposition (ALD).

After forming the blanket layer of sacrificial gate dielectric material, a blanket layer of a sacrificial gate material can be formed on the blanket layer of sacrificial gate dielectric material. The sacrificial gate material can include any material including, for example, polysilicon, amorphous silicon, an elemental metal (e.g., tungsten, titanium, tantalum, aluminum, nickel, ruthenium, palladium and platinum), an alloy of at least two elemental metals or multilayered combinations thereof. The sacrificial gate material can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes.

After forming the blanket layer of sacrificial gate material, a blanket layer of a sacrificial gate cap material can be formed. The sacrificial gate cap material may include a hard mask material such as, for example, silicon dioxide and/or silicon nitride. The sacrificial gate cap material can be formed by any suitable deposition process such as, for example, chemical vapor deposition (CVD) or plasma enhanced chemical vapor deposition (PECVD).

After providing the above mentioned sacrificial material stack (or any subset of the sacrificial materials), lithography and etching can be used to pattern the sacrificial material stack (or any subset of the sacrificial materials) and to provide the at least one sacrificial gate structure 16. The remaining portions of the sacrificial gate dielectric material constitute a sacrificial gate dielectric portion, the remaining portions of the sacrificial gate material constitute a sacrificial gate portion, and the remaining portions of the sacrificial dielectric cap material constitute a sacrificial dielectric cap portion.

After providing the sacrificial gate structure 16, the dielectric spacer material layer 18 can be formed on exposed surfaces of each sacrificial gate structure 16. The dielectric spacer material layer 18 can be formed by first providing a dielectric spacer material and then etching the dielectric spacer material. One example of a dielectric spacer material that may be employed in the present application is silicon nitride.

The dielectric spacer material that provides the dielectric spacer material layer 18 may be provided by a deposition process including, for example, chemical vapor deposition (CVD), plasma enhanced chemical vapor deposition (PECVD), or physical vapor deposition (PVD). The etch used to provide the dielectric spacer material layer 18 may comprise a dry etching process such as, for example, reactive ion etching.

Figure 3:
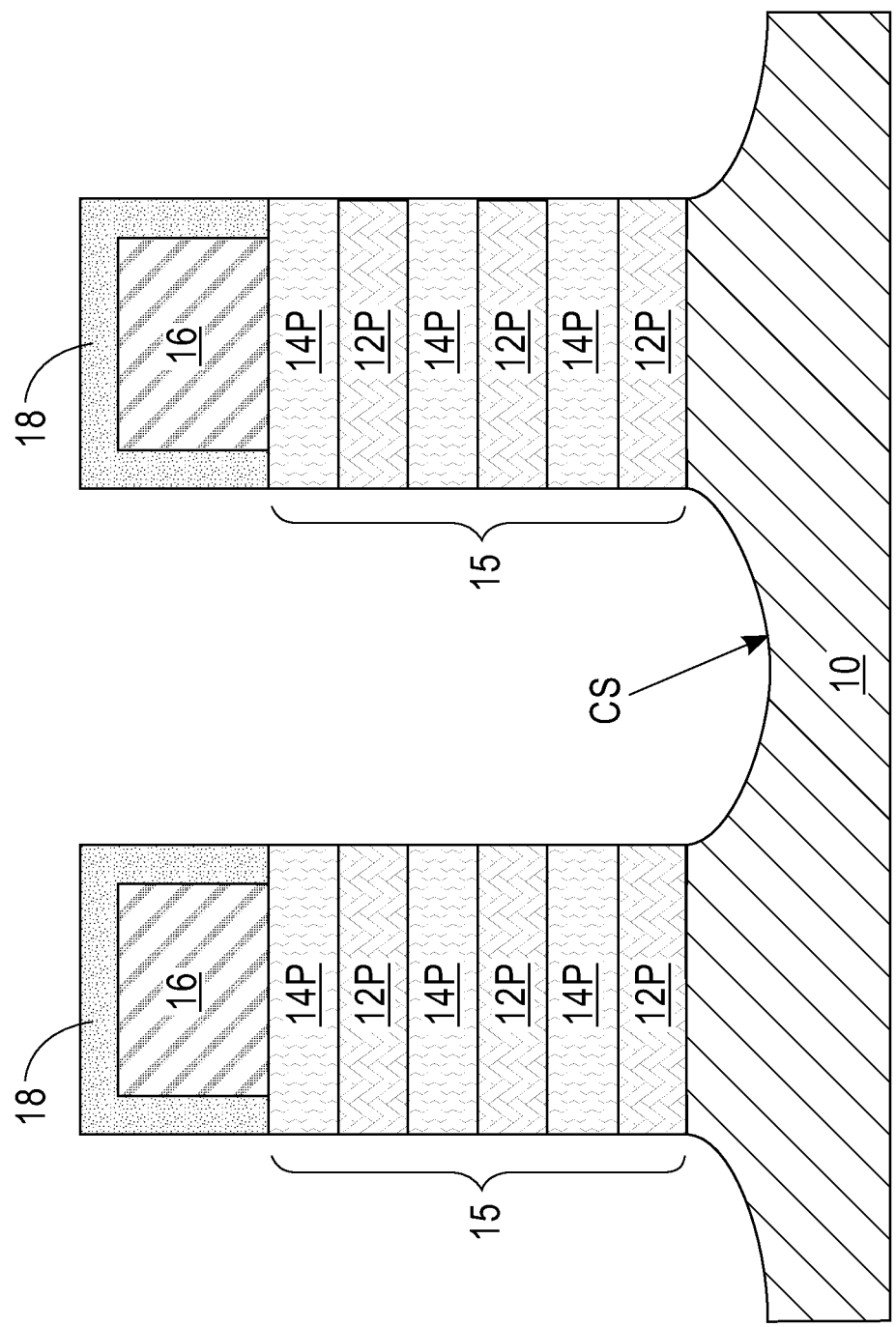
FIG. 3 is a cross sectional view of the exemplary semiconductor structure of FIG. 2 after forming a nanosheet stack of alternating nanosheets of a sacrificial semiconductor material nanosheet and a semiconductor channel material nanosheet under the least one sacrificial gate structure and the dielectric spacer material layer by removing physically exposed portions of the semiconductor material stack that are not protected by the least one sacrificial gate structure and the dielectric spacer material layer.

Referring now to FIG. 3, there is illustrated the exemplary semiconductor structure of FIG. 2 after forming a nanosheet stack 15 of alternating nanosheets of a sacrificial semiconductor material nanosheet 12L and a semiconductor channel material nanosheet 14L that are under the least one sacrificial gate structure 16 and the dielectric spacer material layer 18. For clarity, FIGS. 3-9 do not show the individual regions (10A, 10B, 10C) of the semiconductor substrate 10.

The nanosheet stack 15 is formed by removing physically exposed portions of the semiconductor stack (12L, 14L) that are not protected by the least one sacrificial gate structure 16 and the dielectric spacer material layer 18. During this step of the present application, a portion of the semiconductor substrate 10 may also be removed, i.e., recessed, to provide a recessed surface. In such an embodiment, the recessed surface of the semiconductor substrate 10 may be a concave surface, CS.

The removing of the portions of the semiconductor material stack (12L, 14L) not covered by the least one sacrificial gate structure 16 and the dielectric spacer material layer 18 can be performed utilizing an anisotropic etching process such as, for example, reactive ion etching (RIE). Portions of the semiconductor material stack (12L, 14L) remain beneath the least one sacrificial gate structure 16 and the dielectric spacer material layer 18. The remaining portion of the semiconductor material stack that is presented beneath the least one sacrificial gate structure 16 and the dielectric spacer material layer 18 is referred to as nanosheet stack 15.

Nanosheet stack 15 includes alternating nanosheets of remaining portions of each sacrificial semiconductor material layer (referred to herein as sacrificial semiconductor material nanosheet 12P) and remaining portions of each semiconductor channel material layer (referred to herein as semiconductor channel material nanosheet 14P).

Each nanosheet, i.e., sacrificial semiconductor material nanosheet 12P and semiconductor channel material nanosheet 14P, that constitutes the nanosheet stack 15 has a thickness as mentioned above for the individual sacrificial semiconductor material layers 12L and semiconductor channel material layers 14L, and a width from 30 nm to 200 nm. At this point of the present application and as illustrated in FIG. 3, the sidewalls of each sacrificial semiconductor material nanosheet 12P are vertically aligned to sidewalls of each semiconductor channel material nanosheet 14P, and the vertically aligned sidewalls of the nanosheet stack 15 are vertically aligned to an outmost sidewall of the dielectric spacer material layer 18.

Figure 4:
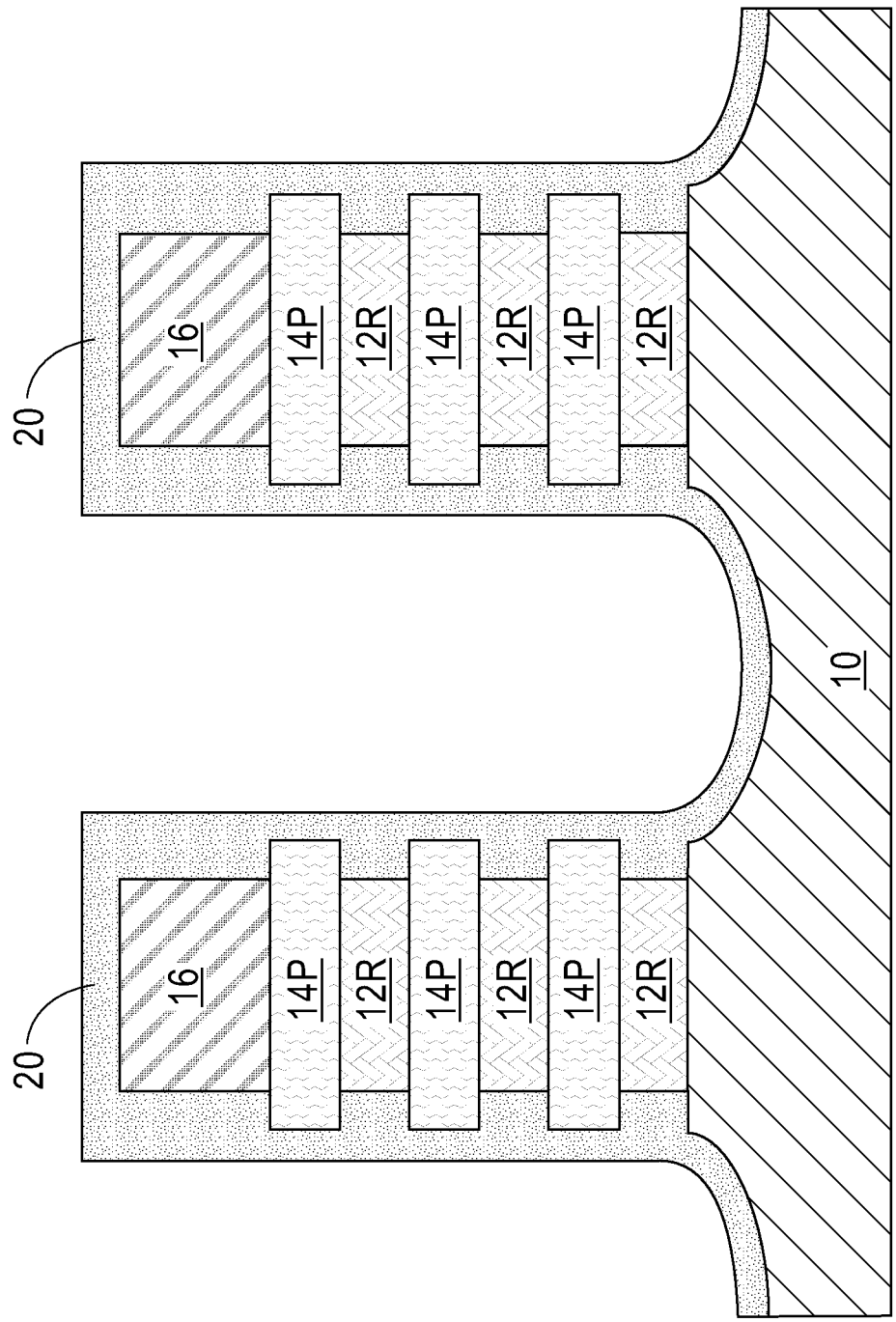
FIG. 4 is a cross sectional view of the exemplary semiconductor structure of FIG. 3 after recessing each sacrificial semiconductor material nanosheet and forming additional dielectric spacer material; the dielectric spacer material layer and the additional dielectric spacer material are referred to as a dielectric gate spacer material layer.

Referring now to FIG. 4, there is illustrated the exemplary semiconductor structure of FIG. 3 after recessing each sacrificial semiconductor material nanosheet 12P and forming additional dielectric spacer material.

Each recessed sacrificial semiconductor material nanosheet is designated as element 12R in the drawings of the present application. Each recessed sacrificial semiconductor material nanosheet 12R has a width that is less than the original width of each sacrificial semiconductor material nanosheet 12P. The recessing of each sacrificial semiconductor material nanosheet 12P provides a gap (not specifically shown) between each neighboring pair of semiconductor channel material nanosheets 14P within a given nanosheet stack 15. The recessing of each sacrificial semiconductor material nanosheet 12P may be performed utilizing a lateral etching process that is selective in removing physically exposed end portions of each sacrificial semiconductor material nanosheet 12P relative to each semiconductor channel material nanosheet 14P.

The additional dielectric spacer material that is added is compositionally the same as the dielectric spacer material layer 18 mentioned above. In one example, the additional dielectric spacer material and the dielectric spacer material layer 18 are both composed of silicon nitride. For clarity, the additional dielectric spacer material and the dielectric spacer material layer 18 can now be referred to as dielectric gate spacer material layer 20. It is noted that the additional dielectric spacer material forms on the physically exposed surfaces of the dielectric spacer material layer 18 and within each gap created by the recessing of each sacrificial semiconductor material nanosheet 12. The additional dielectric spacer material can be formed utilizing one of the deposition processes mentioned above in forming the dielectric spacer material layer 18.

Figure 5:
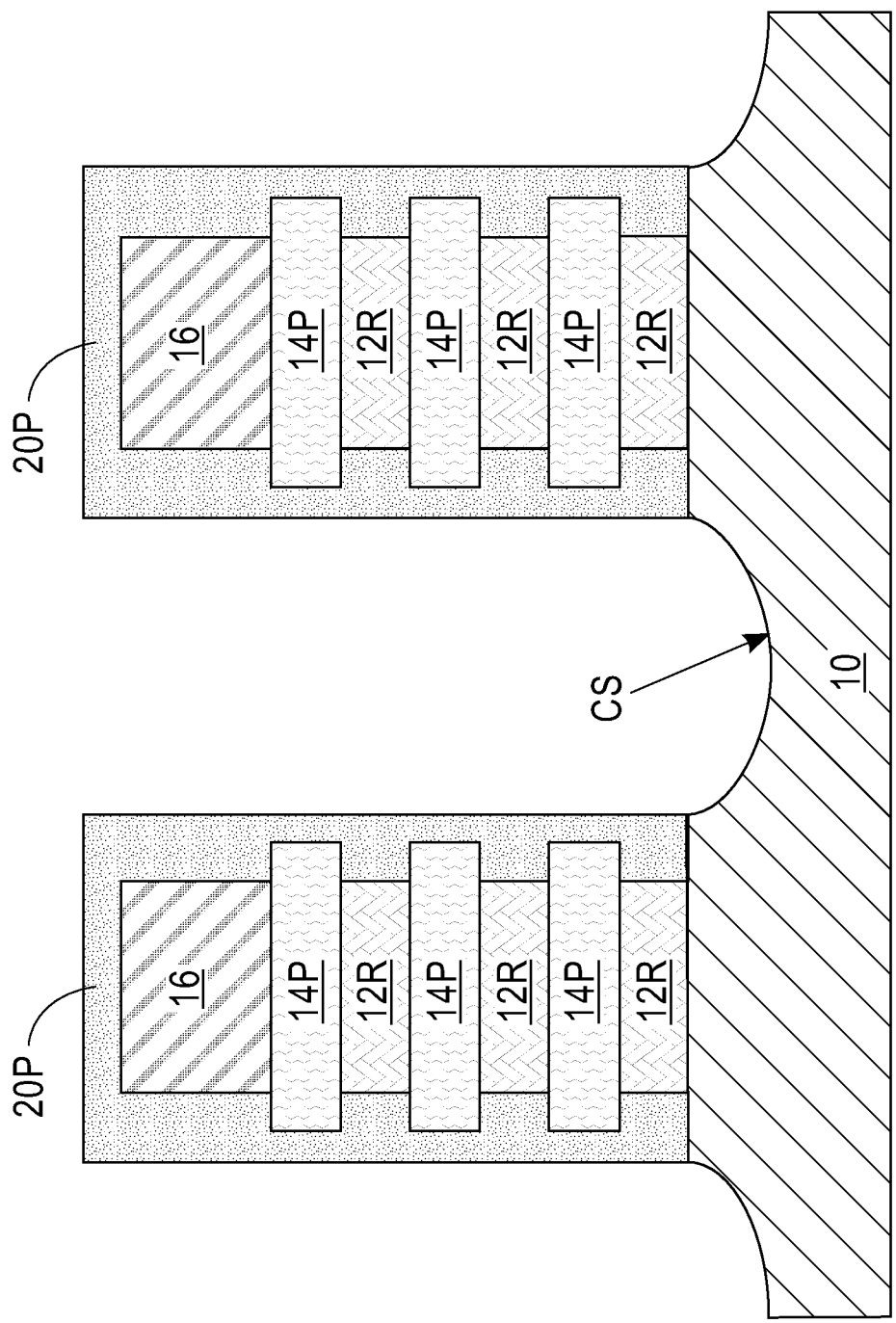
FIG. 5 is a cross sectional view of the exemplary semiconductor structure of FIG. 4 after removing the dielectric gate spacer material layer from the recessed surface of the semiconductor substrate.

Referring now to FIG. 5, there is shown the exemplary semiconductor structure of FIG. 4 after removing the dielectric gate spacer material layer 20 from the recessed surface of the semiconductor substrate 10; the remaining dielectric gate spacer material layer 20 may be referred to herein as a dielectric gate spacer material portion 20P. The dielectric gate spacer material layer 20 may be removed from the recessed surface of the semiconductor substrate 10 utilizing a directional etching process. In one example, gas cluster ion beam etching may be used to remove the dielectric gate spacer material layer 20 from the recessed surface of the semiconductor substrate 10. The removal of the dielectric gate spacer material layer 20 from the recessed surface of the semiconductor substrate 10 re-exposes the recessed surface of the semiconductor substrate 10. In the illustrated embodiment of FIG. 5, the concave surface, CS, is re-exposed.

Figure 6:
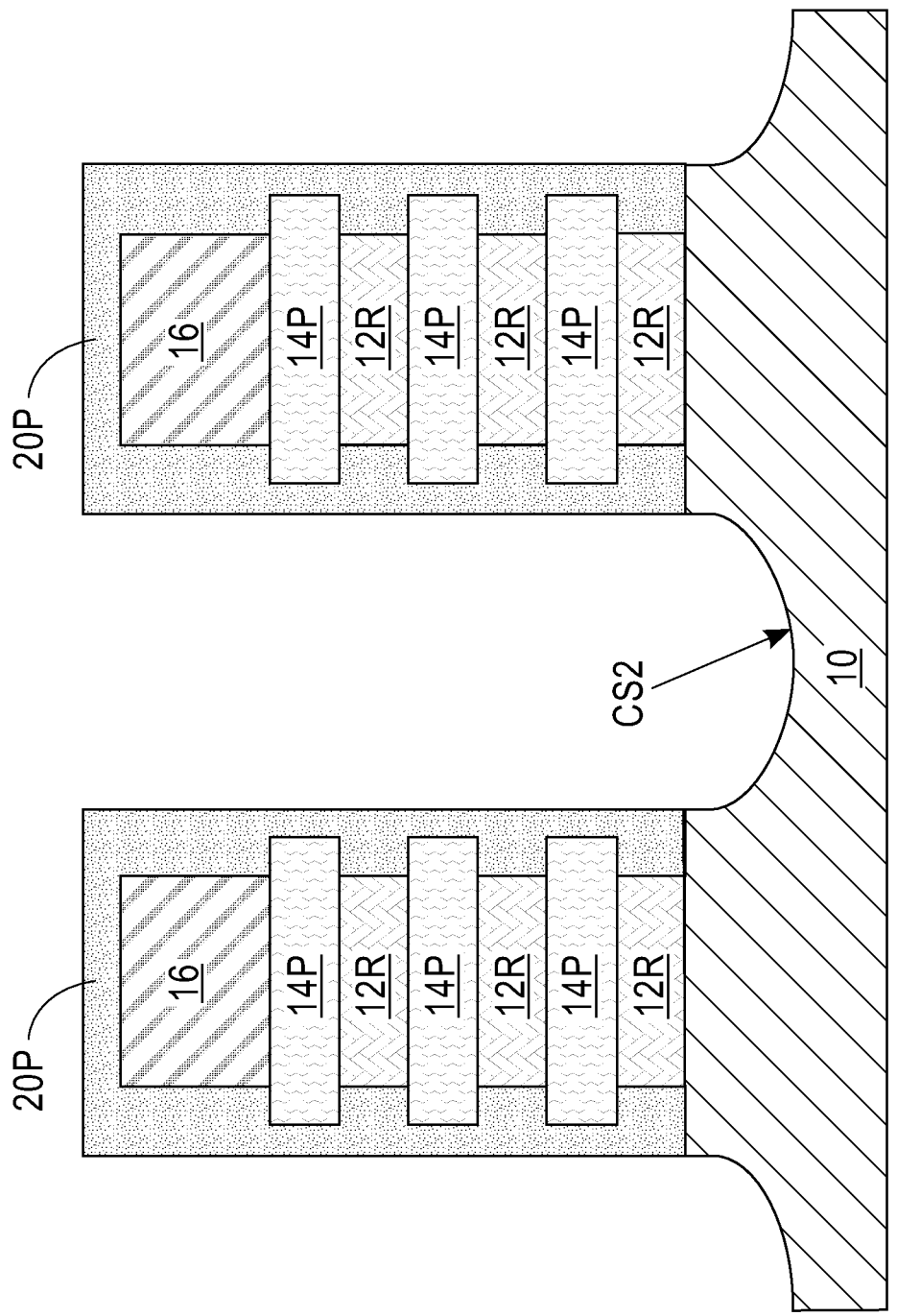
FIG. 6 is a cross sectional view of the exemplary semiconductor structure of FIG. 5 after performing an optional second recessing of the semiconductor substrate.

Referring now to FIG. 6, there is illustrated the exemplary semiconductor structure of FIG. 5 after performing an optional second recessing of the semiconductor substrate 10; the second recessing can provide increased area for forming the counter doped semiconductor layer. In some embodiments, this step is optional. The optional second recess may provide semiconductor substrate 10 with another concave surface, CS2.

The optional second recessing may be performed utilizing an etching process such as, for example, reactive ion etching (RIE). No etching/recessing of the recessed sacrificial semiconductor material nanosheets 12R and the semiconductor channel material nanosheets 14P within a given nanosheet stack 15 is observed since the same are protected by the sacrificial gate structure 16 and a portion of the dielectric gate spacer material layer 20.

Figure 7:
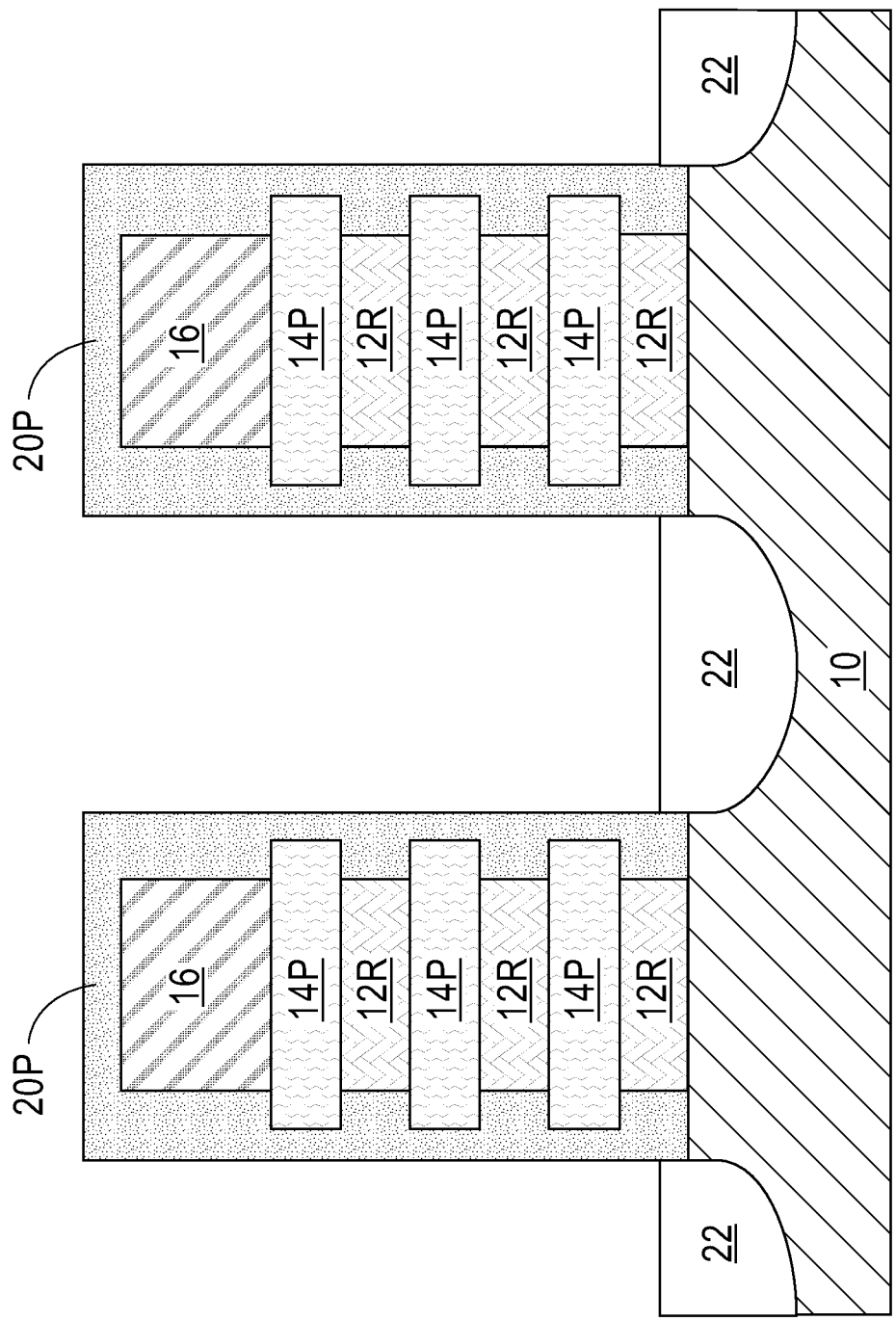
FIG. 7 is a cross sectional view of the exemplary semiconductor structure of FIG. 6 after epitaxial growth of a counter doped semiconductor layer on the physically exposed recessed surface of the semiconductor substrate.

Referring now to FIG. 7, there is illustrated the exemplary semiconductor structure of FIG. 6 after epitaxial growth of a counter doped semiconductor layer 22 on the physically exposed recessed surface of the semiconductor substrate 10. In some embodiments, the counter doped semiconductor layer 22 can be formed on the physically exposed recessed surface of the semiconductor substrate of the exemplary semiconductor structure shown in FIG. 5.

The counter doped semiconductor layer 22 includes a semiconductor material and a dopant (p-type or n-type) that is opposite to the dopant present in the semiconductor substrate 10; the counter doped semiconductor layer 22 that is formed thus is composed of a semiconductor material of a second conductivity type that is different from the first conductivity type of semiconductor substrate 10. The counter doped semiconductor layer 22 may include one of the semiconductor materials mentioned above for the semiconductor substrate 10. In one embodiment, the counter doped semiconductor layer 22 is composed of a same semiconductor material as that which provides the semiconductor substrate. 10. In another embodiment, the counter doped semiconductor layer 22 is composed of a different semiconductor material than that which provides the semiconductor substrate 10.

As stated above, the counter doped semiconductor layer 22 is of an opposite conductivity type than the semiconductor substrate 10. In one embodiment, and when the semiconductor substrate has a p-type conductivity, then the counter doped semiconductor layer 22 has an n-type conductivity. In another embodiment, and when the semiconductor substrate has an n-type conductivity, then the counter doped semiconductor layer 22 has a p-type conductivity. The concentration of dopant present in the counter doped semiconductor layer 22 is in a range from $8 \times 10^{19}$ atoms/cm$^3$ to $8 \times 10^{20}$ atoms/cm$^3$.

The counter doped semiconductor layer 22 can be formed utilizing a selective epitaxial growth process, i.e., the semiconductor material that provides the counter doped semiconductor layer 22 is grown only from physically exposed semiconductor surfaces. The epitaxial growth of the counter doped semiconductor layer 22 may be performed in one of the apparatuses mentioned above for epitaxial growth. The temperature for epitaxial growth of the counter doped semiconductor layer 22 typically ranges from 550° C. to 900° C. The epitaxial growth of the counter doped semiconductor layer 22 can be performed utilizing any well known precursor gas or gas mixture. Carrier gases like hydrogen, nitrogen, helium and argon can be used. The dopant is typically added to the precursor gas or gas mixture that provides the counter doped semiconductor layer 22.

The counter doped semiconductor layer 22 has a topmost surface that may or may not be coplanar with the topmost surface of the semiconductor substrate 10 that is present directly beneath the sacrificial gate structure 16. In one embodiment, the counter doped semiconductor layer 22 may extend from 10 nm to 30 nm below the topmost surface of the semiconductor substrate and have a maximum height above the topmost surface of the semiconductor substrate of 5 nm.

Figure 8:
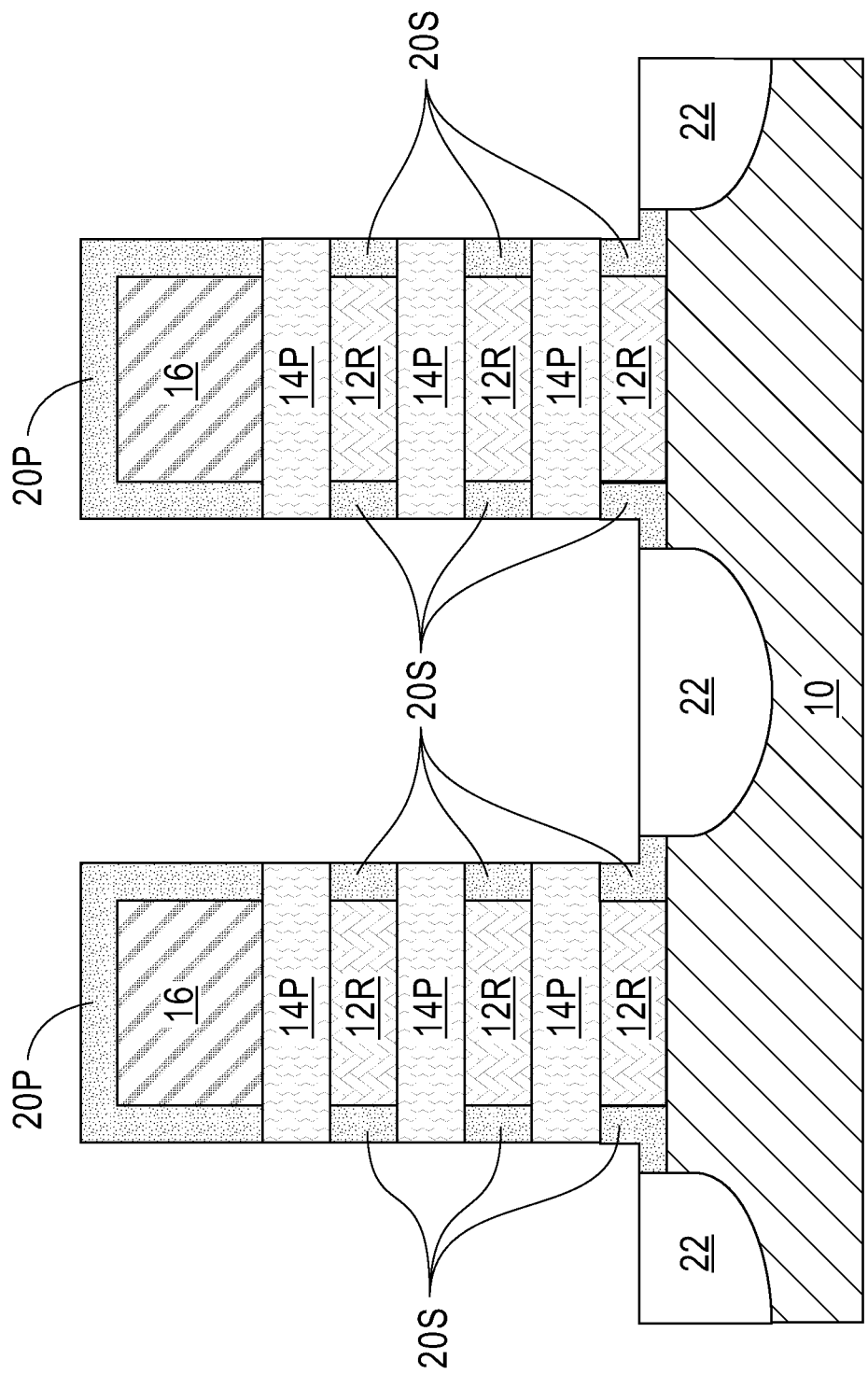
FIG. 8 is a cross sectional view of the exemplary semiconductor structure of FIG. 7 after forming inner gate spacers.

Referring now to FIG. 8, there is illustrated the exemplary semiconductor structure of FIG. 7 after forming inner gate spacers 20S. The inner gate spacers 20S are formed in the gaps created during the formation of each recessed sacrificial semiconductor material nanosheet 12R. The formation of the inner gate spacers 20S can be performed utilizing a material removal process such, as for example, etching. The inner gate spacers 20S comprise a non-etched portion of the dielectric gate spacer material portion 20P that remains in each of the gaps.

Figure 9:
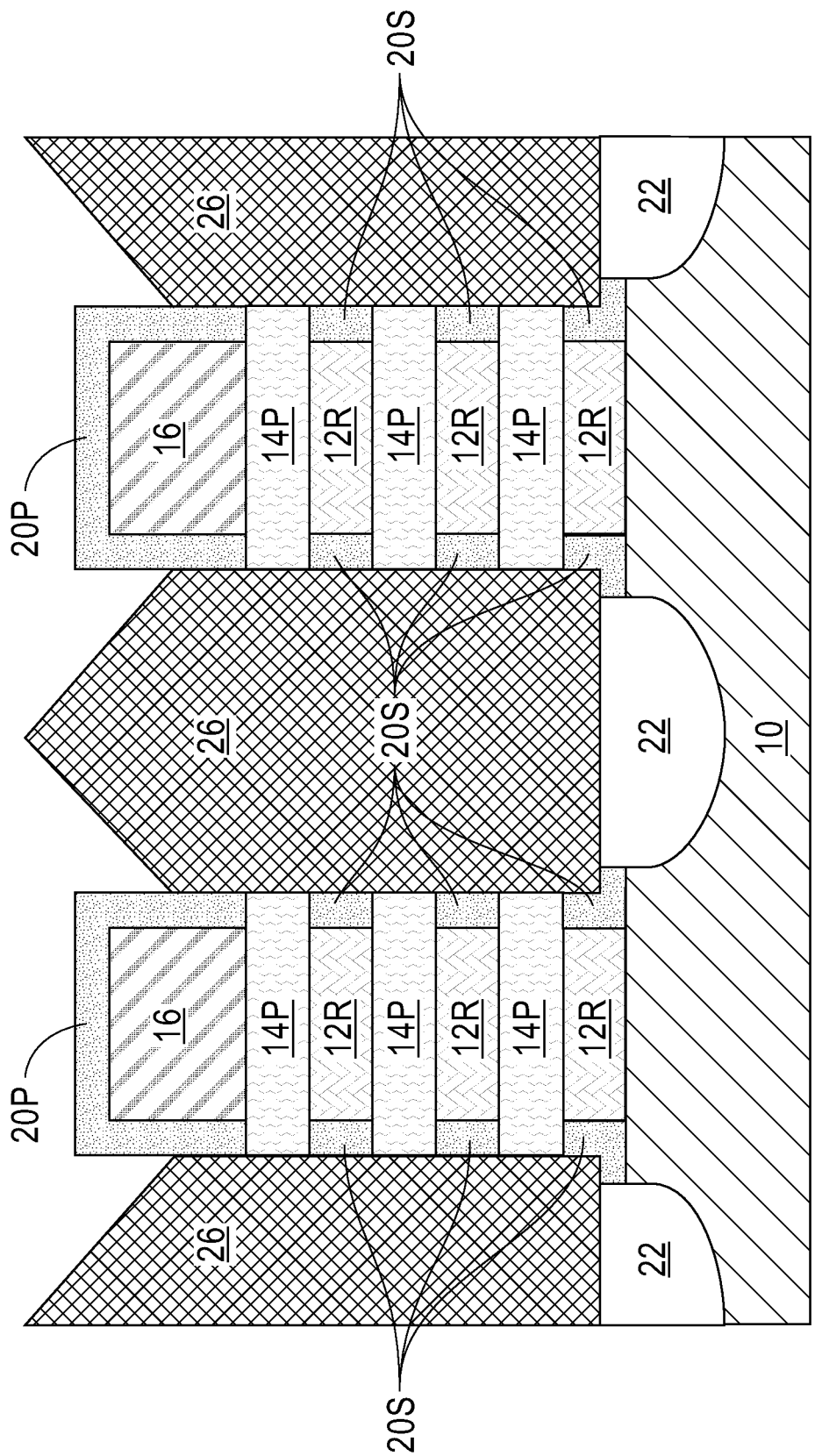
FIG. 9 is a cross sectional view of the exemplary semiconductor structure of FIG. 8 after forming source/drain (S/D) regions by epitaxial growth of a semiconductor material on physically exposed sidewalls of each semiconductor channel material nanosheet.

Referring now to FIG. 9, there is illustrated the exemplary semiconductor structure of FIG. 8 after forming source/drain (S/D) regions 26 by epitaxial growth of a semiconductor material on physically exposed sidewalls of each semiconductor channel material nanosheet 14P. In the present application, the semiconductor material that provides the S/D regions 26 grows laterally out from the sidewalls of each semiconductor channel material nanosheet 14P. The S/D regions 26 have a bottommost surface that directly contacts a topmost surface of the counter doped semiconductor layer 22. In some embodiments, each S/D region 26 has a faceted upper surface.

Each S/D region 26 includes a semiconductor material and a dopant. The semiconductor material that provides each S/D region 26 can be selected from one of the semiconductor materials mentioned above for the semiconductor substrate 10. In some embodiments of the present application, the semiconductor material that provides each S/D region 26 may comprise a same semiconductor material as that which provides each semiconductor channel material nanosheet 14P. In other embodiments of the present application, the semiconductor material that provides each S/D region 26 may comprise a different semiconductor material than that which provides each semiconductor channel material nanosheet 14P. For example, the semiconductor material that provides each S/D regions may comprise a silicon germanium alloy, while each semiconductor channel material nanosheet 14P may comprise silicon.

The dopant that is present in each S/D region 26 can be either a p-type dopant or an n-type dopant, as defined above. In one embodiment, the dopant that can be present in the each S/D region 26 can be introduced into the precursor gas that provides each S/D region 26. In another embodiment, the dopant can be introduced into an intrinsic semiconductor layer by utilizing one of ion implantation or gas phase doping. In one example, each S/D region 26 comprises a silicon germanium alloy that is doped with a p-type dopant such as, for example, boron. As mentioned above, each S/D region 26 is formed by an epitaxial growth (or deposition) process, as is defined above in forming the first and second semiconductor materials.

Figure 10:
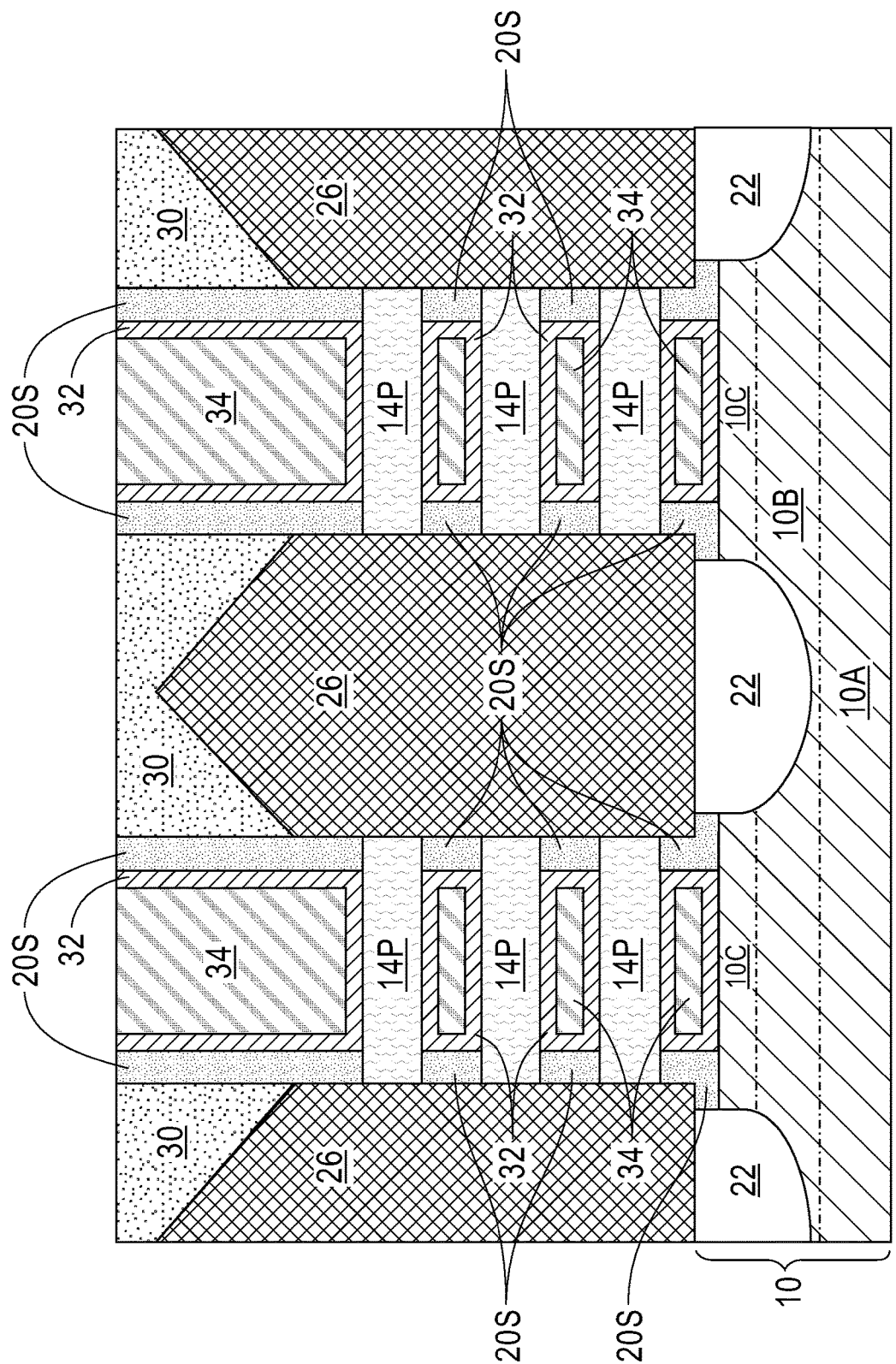
FIG. 10 is a cross sectional view of the exemplary structure of FIG. 9 after formation of an interlevel dielectric (ILD) material, removing each sacrificial gate structure and each recessed sacrificial semiconductor material nanosheet, and forming a functional gate structure around a physically exposed surface of each semiconductor channel material nanosheet.

Referring now to FIG. 10, there is illustrated the exemplary structure of FIG. 8 after formation of an interlevel dielectric (ILD) material 30, removing each sacrificial gate structure 16 and each recessed sacrificial semiconductor material nanosheet 12R, and forming a functional gate structure (32, 34) around a physically exposed surface of each semiconductor channel material nanosheet 14P.

The ILD material 30 may be composed of silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than silicon dioxide. In another embodiment, a self-planarizing material such as a spin-on glass (SOG) or a spin-on low-k dielectric material such as SiLK™ can be used as ILD material 30. The use of a self-planarizing dielectric material as the ILD material 30 may avoid the need to perform a subsequent planarizing step.

In one embodiment, the ILD material 30 can be formed utilizing a deposition process including, for example, chemical vapor deposition (CVD), plasma enhanced chemical vapor deposition (PECVD), evaporation or spin-on coating. In some embodiments, particularly when non-self-planarizing dielectric materials are used as the ILD material 30, a planarization process or an etch back process follows the deposition of the dielectric material that provides the ILD material 30. As is shown, the ILD material 30 that is present atop each S/D region 26 has a topmost surface that is coplanar with a topmost surface of the functional gate structure (32, 34) to be subsequently formed.

After providing the ILD material 30, a horizontal portion of dielectric gate spacer material portion 20P is removed from atop each sacrificial gate structure 16 to provide topmost inner gate spacers 20S, and thereafter each sacrificial gate structure 16 is removed to provide a gate cavity (not specifically shown). The removal of the horizontal portion of dielectric gate spacer material portion 20P that is above each sacrificial gate structure 16 can be performed utilizing one or more anisotropic etching processes.

Next, each semiconductor channel material nanosheet 14P is suspended by selectively etching each recessed sacrificial semiconductor material nanosheet 12R relative to each semiconductor channel material nanosheet 14P. A functional gate structure (32, 34) is then formed in each gate cavity and surrounding a physically exposed surface of each semiconductor channel material nanosheet 14P. By "functional gate structure" it is meant a permanent gate structure used to control output current (i.e., flow of carriers in the channel) of a semiconducting device through electrical or magnetic fields.

The functional gate structure (32, 34) may include a gate dielectric portion 32 and a gate conductor portion 34. The gate dielectric portion 32 may include a gate dielectric material. The gate dielectric material that provides the gate dielectric portion 32 can be an oxide, nitride, and/or oxynitride. In one example, the gate dielectric material that provides the gate dielectric portion 32 can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-k gate dielectric, can be formed and used as the gate dielectric portion 32.

The gate dielectric material used in providing the gate dielectric portion 32 can be formed by any deposition process including, for example, chemical vapor deposition (CVD), plasma enhanced chemical vapor deposition (PECVD), physical vapor deposition (PVD), sputtering, or atomic layer deposition. In one embodiment of the present application, the gate dielectric material used in providing the gate dielectric portion 32 can have a thickness in a range from 1 nm to 10 nm. Other thicknesses that are lesser than, or greater than, the aforementioned thickness range can also be employed for the gate dielectric material that may provide the gate dielectric portion 32.

The gate conductor portion 34 can include a gate conductor material. The gate conductor material used in providing the gate conductor portion 34 can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. In one embodiment, the gate conductor portion 34 may comprise an nFET gate metal. In another embodiment, the gate conductor portion 34 may comprise a pFET gate metal. When multiple gate cavities are formed, it is possible to form a nFET in a first set of the gate cavities and wrapping around some of the semiconductor channel material nanosheet 14P and a pFET in a second set of the gate cavities and wrapping around some of the semiconductor channel material nano sheet 14P.

The gate conductor material used in providing the gate conductor portion 34 can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed. In one embodiment, the gate conductor material used in providing the gate conductor portion 34 can have a thickness from 50 nm to 200 nm. Other thicknesses that are lesser than, or greater than, the aforementioned thickness range can also be employed for the gate conductor material used in providing the gate conductor portion 34.

The functional gate structure (32, 34) can be formed by providing a functional gate material stack of the gate dielectric material, and the gate conductor material. A planarization process may follow the formation of the functional gate material stack.

Figure 11:
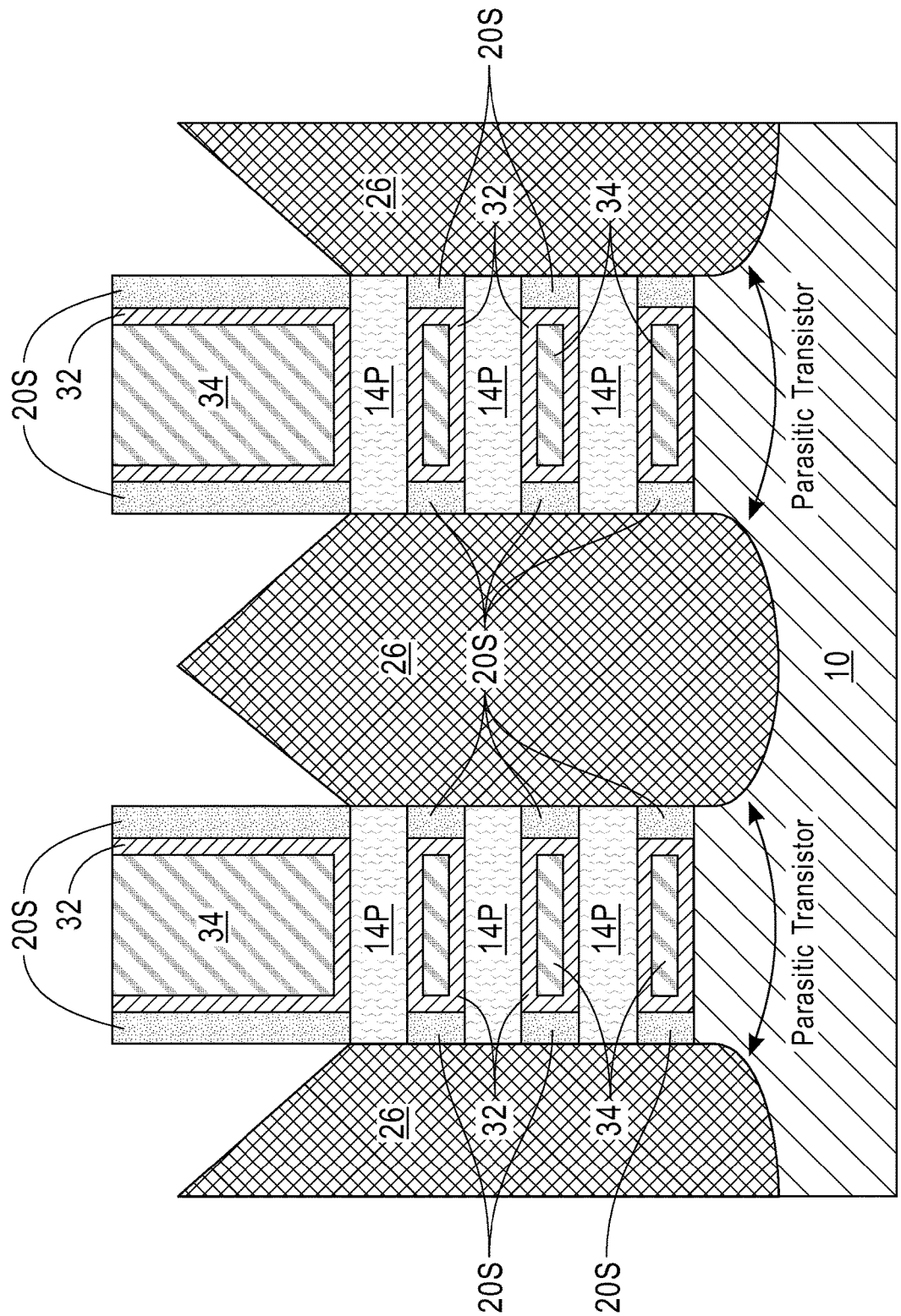
FIG. 11 is a cross sectional view of a prior art semiconductor structure made without the counter doped semiconductor layer of the present application.

Notably, FIG. 10 illustrates an exemplary semiconductor structure in accordance with an embodiment of the present application in which parasitic transistor formation under each semiconductor containing nanosheet device is eliminated; FIG. 11 is a cross sectional view of a prior art semiconductor structure made without the presence of a counter doped semiconductor layer of the present application. As is shown, the semiconductor structure of FIG. 11 has parasitic transistor formation under each of the semiconductor containing nanosheet devices.

As is illustrated in FIG. 10, the exemplary semiconductor structure includes the semiconductor structure includes a plurality of stacked and suspended semiconductor channel material nanosheets 14P located above a semiconductor substrate 10 that is composed of a semiconductor material of a first conductivity type. A functional gate structure (32, 34) surrounds a portion of each semiconductor channel material nanosheet 14P of the plurality of stacked and suspended semiconductor channel material nanosheets. A counter doped semiconductor layer 22 composed of a semiconductor material of a second conductivity type that is different from the first conductivity type is located on a recessed surface of the semiconductor substrate 10. A source/drain (S/D) region 26 is present on each side of the functional gate structure (32, 34) and physically contacts sidewalls of each semiconductor channel material nanosheet 14P of the plurality of stacked and suspended semiconductor channel material nanosheets, wherein the source/drain (S/D) region 26 is located directly on a surface of the counter doped semiconductor layer 22.

As is shown in FIG. 10, the counter doped semiconductor layer 22 extends through the upper region 10C of the semiconductor substrate 10 and extends into the middle region 10B of the semiconductor substrate 10. Such a semiconductor structure may have improved electrostatic properties and no parasitic transistor formation.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
   a plurality of stacked and suspended semiconductor channel material nanosheets located above a semiconductor substrate that is composed of a semiconductor material of a first conductivity type, wherein the semiconductor substrate includes a lower region having a first dopant concentration, a middle region having a second dopant concentration and an upper region having a third dopant concentration, wherein the second dopant concentration is less than the first and third dopant concentrations;
   a functional gate structure surrounding a portion of each semiconductor channel material nanosheet of the plurality of stacked and suspended semiconductor channel material nanosheets;
   a counter doped semiconductor layer composed of a semiconductor material of a second conductivity type that is different from the first conductivity type and located on a recessed surface of the semiconductor substrate; and
   a source/drain (S/D) region on each side of the functional gate structure and physically contacting sidewalls of each semiconductor channel material nanosheet of the plurality of stacked and suspended semiconductor channel material nanosheets, wherein the source/drain (S/D) region is located directly on a surface of the counter doped semiconductor layer.

2. The semiconductor structure of claim 1, wherein the counter doped semiconductor layer extends through the upper region of the semiconductor substrate and into a portion of the middle region of the semiconductor substrate.

3. The semiconductor structure of claim 1, further comprising inner gate spacers contacting sidewalls of the functional gate structure and located on an outer portion of each semiconductor channel material nanosheet of the plurality of stacked and suspended semiconductor channel material nanosheets.

4. The semiconductor structure of claim 1, wherein each source/drain (S/D) region has a faceted upper surface.

5. The semiconductor structure of claim 1, further comprising an interlevel dielectric (ILD) material located above each S/D region.

6. The semiconductor structure of claim 5, wherein the ILD material atop each S/D region has a topmost surface that is coplanar with a topmost surface of the functional gate structure.

7. The semiconductor structure of claim 1, wherein the sidewalls of each semiconductor channel material nanosheet of the plurality of stacked and suspended semiconductor channel material nanosheets are vertically aligned to each other.

8. The semiconductor structure of claim 1, wherein the semiconductor substrate and each semiconductor channel material nanosheet is composed of a same semiconductor material.

9. The semiconductor structure of claim 1, wherein no parasitic transistor is present beneath the plurality of stacked and suspended semiconductor channel material nanosheets.

10. A method of forming a semiconductor structure, the method comprising:
    providing a nanosheet stack of alternating nanosheets of a sacrificial semiconductor material nanosheet and a semiconductor channel material nanosheet located on a surface of a semiconductor substrate composed of a semiconductor material of a first conductivity type, wherein a sacrificial gate structure and a dielectric spacer material layer straddle over the nanosheet stack, and the semiconductor substrate has physically exposed recessed surfaces that lay adjacent the sacrificial gate structure and the dielectric spacer material layer, wherein the semiconductor substrate includes a lower region having a first dopant concentration, a middle region having a second dopant concentration and an upper region having a third dopant concentration, wherein the second dopant concentration is less than the first and third dopant concentrations;
    recessing end portions of each of the sacrificial semiconductor material nanosheets to provide a gap between each of the semiconductor channel material nanosheets;
    forming an additional dielectric spacer material layer on the dielectric spacer material layer and within each gap and on the recessed surfaces of the semiconductor substrate;
    removing the additional dielectric spacer material layer from the recessed surfaces to re-expose the recessed surface;
    forming a counter doped semiconductor layer composed of a semiconductor material of a second conductivity type that differs from the first conductivity type on the re-exposed recessed surfaces of the semiconductor substrate;
    physically exposing sidewalls of each semiconductor channel material nanosheet; and
    forming a source/drain (S/D) region by epitaxial growth of a semiconductor material on the physically exposed sidewalls of each semiconductor channel material nanosheet, wherein each S/D region is present on a surface of one of the counter doped semiconductor layers.

11. The method of claim 10, further comprising forming an interlevel dielectric (ILD) material atop each S/D region.

12. The method of claim 11, further comprising:
    removing the sacrificial gate structure; and
    removing each sacrificial semiconductor material nanosheet to suspend each semiconductor channel material nanosheet.

13. The method of claim 12, further comprising forming a functional gate structure in regions occupied by the sacrificial gate structure and each sacrificial semiconductor material nanosheet, wherein the functional gate structure warps around each suspended semiconductor channel material nanosheet.

14. The method of claim 10, further comprising recessing the recessed surfaces of the semiconductor substrate, wherein the recessing of the recessed surfaces of the semiconductor substrate is performed after removing the additional dielectric spacer material layer from the recessed surfaces and prior to the forming of the counter doped semiconductor layer.

15. The method of claim 10, wherein the forming of the counter doped semiconductor layer comprises an epitaxial growth process.

16. The method of claim 10, wherein the recessing end portions of each sacrificial semiconductor material nanosheet comprises a lateral etching process.

17. A method of forming a semiconductor structure, the method comprising:
providing a nanosheet stack of alternating nanosheets of a sacrificial semiconductor material nanosheet and a semiconductor channel material nanosheet located on a surface of a semiconductor substrate composed of a semiconductor material of a first conductivity type, wherein a sacrificial gate structure and a dielectric spacer material layer straddle over the nanosheet stack, and the semiconductor substrate has physically exposed recessed surfaces that lay adjacent the sacrificial gate structure and the dielectric spacer material layer, wherein each sacrificial semiconductor material nanosheet is composed of a first semiconductor material, and each semiconductor channel material nanosheet is composed of a second semiconductor material that differs from, and has a different etch rate than, the first semiconductor material;
recessing end portions of each of the sacrificial semiconductor material nanosheets to provide a gap between each of the semiconductor channel material nanosheets;
forming an additional dielectric spacer material layer on the dielectric spacer material layer and within each gap and on the recessed surfaces of the semiconductor substrate;
removing the additional dielectric spacer material layer from the recessed surfaces to re-expose the recessed surface;
forming a counter doped semiconductor layer composed of a semiconductor material of a second conductivity type that differs from the first conductivity type on the re-exposed recessed surfaces of the semiconductor substrate;
physically exposing sidewalls of each semiconductor channel material nanosheet; and
forming a source/drain (S/D) region by epitaxial growth of a semiconductor material on the physically exposed sidewalls of each semiconductor channel material nanosheet, wherein each S/D region is present on a surface of one of the counter doped semiconductor layers.

18. The method of claim 17, wherein the semiconductor substrate includes a lower region having a first dopant concentration, a middle region having a second dopant concentration and an upper region having a third dopant concentration, wherein the second dopant concentration is less than the first and third dopant concentrations.

19. The method of claim 18, wherein the counter doped semiconductor layer extends through the upper region of the semiconductor substrate and into a portion of the middle region of the semiconductor substrate.

* * * * *